(12) United States Patent
Park et al.

(10) Patent No.: US 7,247,256 B2
(45) Date of Patent: Jul. 24, 2007

(54) CMP SLURRY FOR FORMING ALUMINUM FILM, CMP METHOD USING THE SLURRY, AND METHOD FOR FORMING ALUMINUM WIRING USING THE CMP METHOD

(75) Inventors: Jeong-heon Park, Gyeonggi-do (KR); Jae-dong Lee, Gyeonggi-do (KR); Sung-jun Kim, Gyeonggi-do (KR); Chang-ki Hong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/961,411

(22) Filed: Oct. 12, 2004

(65) Prior Publication Data

US 2005/0112894 A1    May 26, 2005

(30) Foreign Application Priority Data

Oct. 9, 2003    (KR) ...................... 10-2003-0070281

(51) Int. Cl.
*C09K 13/00*    (2006.01)

(52) U.S. Cl. .................... 252/79.1; 216/88; 216/89; 216/99; 216/102; 438/631; 438/633; 438/693; 438/692

(58) Field of Classification Search ............... 252/79.1; 216/88; 438/693
See application file for complete search history.

(56) References Cited

U.S. PATENT DOCUMENTS

| | | | |
|---|---|---|---|
| 5,209,816 A * | 5/1993 | Yu et al. ...................... | 438/693 |
| 5,858,813 A | 1/1999 | Scherber et al. | |
| 6,194,317 B1 * | 2/2001 | Kaisaki et al. ............... | 438/692 |
| 6,375,545 B1 * | 4/2002 | Yano et al. .................... | 451/36 |
| 6,855,267 B2 * | 2/2005 | Lee et al. ................... | 252/79.1 |
| 2004/0060825 A1 * | 4/2004 | Nagai et al. ................. | 205/291 |

FOREIGN PATENT DOCUMENTS

| | | |
|---|---|---|
| KR | 1020020030138 A | 4/2002 |
| WO | WO 01/76819 A1 | 10/2001 |

* cited by examiner

*Primary Examiner*—Lan Vinh
*Assistant Examiner*—Maki Angadi
(74) *Attorney, Agent, or Firm*—Volentine & Whitt, PLLC

(57) ABSTRACT

A first chemical mechanical polishing (CMP) slurry includes a polishing agent, an oxidant, a pH control additive, and an oxide film removal retarder which reduces a removal rate of the silicon oxide film. A second chemical mechanical polishing (CMP) slurry includes a polishing agent, an oxidant, a pH control additive, an oxide film removal retarder which reduces a removal rate of silicon oxide, and a defect prevention agent which inhibits scratch defects and/or corrosion defects at a surface of an aluminum film. In a one-step CMP process, either of the first or second slurry is used throughout CMP of an aluminum layer until an upper surface of an underlying silicon oxide layer is exposed. In a two-step CMP process, the first slurry is used in an initial CMP of the aluminum layer, and then the second slurry is used in a subsequent CMP until the upper surface of the underlying silicon layer is exposed.

8 Claims, 7 Drawing Sheets

(A)          (B)          (C)

CMP SLURRY FOR FORMING ALUMINUM FILM, CMP METHOD USING THE SLURRY, AND METHOD FOR FORMING ALUMINUM WIRING USING THE CMP METHOD

BACKGROUND OF THE INVENTION

1. Field of the Invention

The present invention generally relates to a chemical mechanical polishing (CMP) slurry and to a method of using the CMP slurry. More particularly, the present invention relates to a CMP slurry for use in polishing of an aluminum film, to a CMP method using the slurry, and to a method of forming an aluminum wiring using the CMP method.

A claim of priority is made to Korean Patent Application No. 2003-70281, filed on Oct. 9, 2003 in the Korean Intellectual Property Office, which is incorporated herein in its entirety by reference.

2. Description of the Related Art

Aluminum is commonly used as the conductive material forming wirings and/or conductive plugs in semiconductor devices. Herein, the term "aluminum" is inclusive of aluminum alloys in which aluminum is the main component.

Conventionally, an aluminum wiring or the like is formed by first depositing an aluminum film by sputtering or chemical vapor deposition (CVD), and then reactive ion etching (RIE) the aluminum film to define a wiring pattern. However, this technique is not well suited to highly integrated devices having extremely small pattern widths and extremely small gaps between patterns. That is, as the pattern density increases, the likelihood of bridges formed between adjacent wiring patterns also increases. Also, voids can form in the aluminum patterns as a result of heat stress induced migration after thermal processing or electro-migration.

A so-called damascene method was thus developed in an effort to overcome the drawbacks associated with the conventional RIE technique. The damascene method generally includes depositing an inter metal dielectric (IMD) layer, patterning the IMD layer to define a metal wiring region within the IMD layer, forming a metal barrier layer on the resultant structure, depositing a thick aluminum film on the metal barrier layer, and removing the aluminum film and the metal barrier layer on an upper surface of the IMD using a CMP process.

The CMP process of the damascene method can substantially impact electrical characteristics of the aluminum wiring. For example, if the removal rate selectivity (etch selectivity) of the aluminum film to the IMD layer (typically silicon oxide) is too low, the aluminum film can be over etched in the CMP process. Over etching can decrease of the surface area of the aluminum wiring, which results in an increased electrical resistance of the aluminum wiring, which in turn can decrease the signal speed of the semiconductor device.

Examples of CMP slurries for aluminum films are disclosed in U.S. Pat. No. 5,209,816 and Japanese Laid-Open Patent No. 10-44047. However, aluminum to silicon oxide removal rate selectivity of the disclosed slurries is less than 20. As such, over etching of the aluminum wiring can result if these slurries are used in the fabrication of highly integrated devices having extremely small wiring dimensions.

Commercially available CMP slurries for aluminum films include those having product designations EP-A5680 (Cabot Co.) and CMP9003 (EKC Co.). EP-A5680 includes alumina as a polishing agent and $H_2O_2$ and $(NH_4)_2S_2O_8$ as oxidants, and has a pH of approximately 3.

The removal rate of an aluminum film when EP-A5680 is used as the polishing slurry deviates widely in a range of 1,500~6000Å per minute. Also, the use of EP-A5680 can result in defects such as scratches and corrosion on the surface of the aluminum film. That is, scratch defects create a surface roughness on the aluminum film and are caused by the polishing agent contacting the surface of the aluminum film. In severe cases, the scratch defect can form a pit in the surface of the aluminum film which can adversely affect device performance. Corrosion can result when aluminum ions break away from the aluminum film by a chemical reaction with other materials. These defects are generally the result of material characteristics of aluminum, i.e., relatively low hardness and low resistance to stress. Scratches or corrosion on the aluminum film can reduce the reflective index of the aluminum film and decrease reliability of the aluminum wiring. In some cases, these defects can lead to discontinuities (open circuits) in the aluminum wiring.

The CMP9003 slurry exhibits comparatively less scratch related defects than the EP-A5680 slurry. However, aluminum to silicon oxide removal rate selectivity of the CMP9003 slurry is relatively low, which as discussed above can lead to problems when using the slurry in the fabrication of highly integrated semiconductor devices.

SUMMARY OF THE INVENTION

According to a first aspect of the present invention, a chemical mechanical polishing (CMP) slurry is provided for use in the CMP of an aluminum film formed over a silicon oxide film. The CMP slurry includes a polishing agent, an oxidant, a pH control additive, and an oxide film removal retarder which reduces a removal rate of the silicon oxide film.

According to another aspect of the present invention, a chemical mechanical polishing (CMP) slurry is provided for use in the CMP of an aluminum film formed over a silicon oxide film. The CMP slurry includes a polishing agent, an oxidant, a pH control additive, an oxide film removal retarder which reduces a removal rate of the silicon oxide film, and a defect prevention agent which inhibits at least one of scratch defects and corrosion defects at a surface of the aluminum film.

According to still another aspect of the present invention, a chemical mechanical polishing (CMP) slurry is provided which includes colloidal silica, hydrogen peroxide, a pH control additive, and polyethylene imine.

According to yet another aspect of the present invention, a chemical mechanical polishing (CMP) slurry is provided which includes colloidal silica, hydrogen peroxide, a pH control additive, polyethylene imine, and at least one of ethylenediaminetetra-acetic acid (EDTA) and an a salt of EDTA.

According to another aspect of the present invention, a method is provided for treating an aluminum film formed over a silicon oxide layer. The method includes providing a slurry containing a polishing agent, an oxidant, a pH control additive, and an oxide film removal retarder which reduces a removal rate of the silicon oxide film, and performing a chemical mechanical polishing (CMP) of the aluminum film using the slurry.

According to another aspect of the present invention, a method is provided of treating an aluminum film formed over a silicon oxide film. The method includes providing a first slurry containing a polishing agent, an oxidant, a pH control additive, and an oxide film removal retarder which reduces a removal rate of the silicon oxide film, and performing a first chemical mechanical polishing (CMP) of the aluminum film using the first slurry. The method further includes providing a second slurry containing a polishing agent, an oxidant, a pH control additive, an oxide film removal retarder which reduces a removal rate of the silicon oxide film, and a defect prevention agent which inhibits at least one of scratch defects and corrosion defects at a surface of the aluminum film, and performing a second CMP of the aluminum film using the second slurry. The first slurry is devoid of the defect prevention agent contained in the second slurry.

According to another aspect of the present invention, a method is provided of forming an aluminum wiring. The method includes forming an inter metal dielectric (IMD) layer containing silicon oxide over a semiconductor substrate, patterning the IMD layer to define an aluminum wiring region, forming a metal barrier layer on the patterned IMD layer to obtain a resultant structure, and coating the resultant structure with an aluminum film. The method further includes providing a slurry containing a polishing agent, an oxidant, a pH control additive, and an oxide film removal retarder which reduces a removal rate of the silicon oxide film, and performing a chemical mechanical polishing (CMP) of the aluminum film using the slurry to form an aluminum wiring within the aluminum wiring region.

According to yet another aspect of the present invention, a method is provided of forming an aluminum wiring. The method includes forming an inter metal dielectric (IMD) layer containing silicon oxide over a semiconductor substrate, patterning the IMD layer to define an aluminum wiring region, forming a metal barrier layer on the patterned IMD layer to obtain a resultant structure, and coating the resultant structure with an aluminum film. The method further includes providing a first slurry containing a polishing agent, an oxidant, a pH control additive, and an oxide film removal retarder which reduces a removal rate of the silicon oxide film, and performing a first chemical mechanical polishing (CMP) of the aluminum film using the first slurry. The method still further includes providing a second slurry containing a polishing agent, an oxidant, a pH control additive, an oxide film removal retarder which reduces a removal rate of the silicon oxide film, and a defect prevention agent which inhibits at least one of scratch defects and corrosion defects at a surface of the aluminum film, and performing a second CMP of the aluminum film using the second slurry to form an aluminum wiring within the aluminum wiring region. The first slurry is devoid of the defect prevention agent contained in the second slurry.

BRIEF DESCRIPTION OF THE DRAWINGS

The various aspects and features of the present invention will become readily apparent from the detailed description that follows, with reference to the accompanying drawings, in which.

DETAILED DESCRIPTION OF THE PREFERRED EMBODIMENTS

Figure 1A:
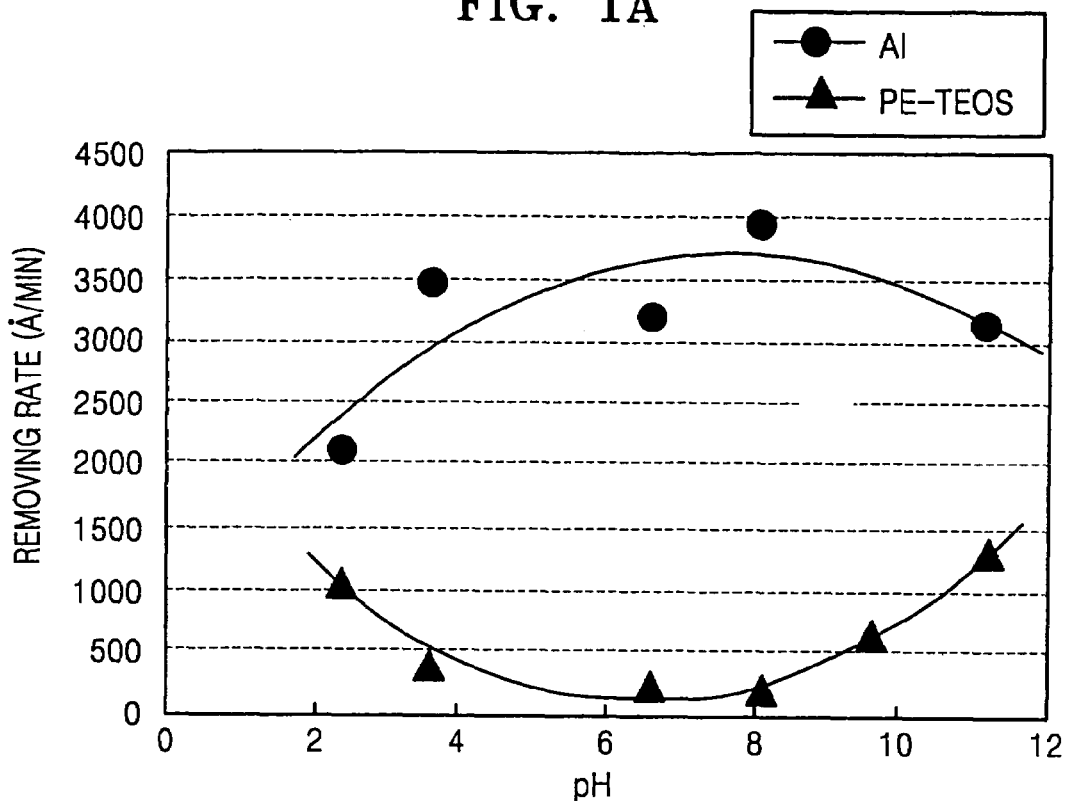
FIG. 1A is a graph showing removal rates of an aluminum film and a PE-TEOS film relative to the pH of a CMP slurry including phosphoric acid and potassium hydroxide.

Hereinafter, the present invention will be described more fully with reference to the accompanying drawings in which exemplary embodiment of the invention are shown. This invention may, however, be embodied in many different forms and should not be construed as being limited to the embodiments set forth herein. Rather, these embodiments are provided so that this disclosure is thorough and complete, and fully conveys the concept of the invention to those skilled in the art. In the drawings, the thickness of layers and regions are exaggerated for clarity. To facilitate understanding, identical reference numerals have been used, where possible, to designate identical elements that are common to the figures.

CMP Slurry of a First Embodiment

A slurry for CMP of an aluminum film according to a first embodiment of the present invention is a compound containing a polishing agent, an oxidant, a pH control additive, and an oxide film removal retarder which reduces a removal rate of a silicon oxide film.

Colloidal silica ($SiO_2$) is a preferred polishing agent for the slurry of the first embodiment. Other exemplary compounds that can be alternatively or additionally used as a polishing agent are alumina ($Al_2O_3$), ceria ($CeO_2$), mangania ($MnO_2$), or zirconia ($ZrO_2$), or a composite of two or more of these materials. The polishing agent should cause minimum scratching on the surface of the aluminum film during a CMP process, and accordingly, the polishing agent should preferably have a small and uniform particle size distribution. Colloidal silica meets this characteristic requirement. A desirable ratio of the polishing agent in the first slurry to a total weight of the first slurry is 2~20 wt %, preferably about 8~12 wt %, and more preferably about 10 wt %.

Hydrogen peroxide ($H_2O_2$) is a preferred oxidant for the slurry of the first embodiment. The oxidant forms an aluminum oxide film on a surface of the aluminum film by a reaction with aluminum ions. Other exemplary compounds that can be alternatively or additionally used for the oxidant include ammonium cerium nitrate IV (($NH_4$)$_2$$Ce(NO_3)_6$), hydroxylamine ($NH_2OH$), and ammonium per-sulfate (($NH_4)_2S_2O_8$). The removal rate of aluminum, a removal rate selectivity of an aluminum film to a silicon oxide film, and/or a surface characteristic of the aluminum film after performing a CMP process, are factors that may be taken into consideration when selecting an oxidant. Preferably, the oxidant is hydrogen peroxide. A mixing ratio of the hydrogen peroxide based on the total weight of the first slurry may be approximately in a range of 0.5~5 wt %.

Nitric acid and/or potassium hydroxide are preferred pH control additives for the slurry of the first embodiment. Other exemplary compounds that can be alternatively or additionally used as a pH control additive are other inorganic acids (such as sulfuric acid, hydrochloric acid, phosphoric acid, citric acid, succinic acid, glutaric acid and tartaric acid), organic acids, and other salts such as sodium hydroxide. The removal rate of the silicon oxide film substantially depends on the pH of the slurry. More precisely, the removal rate of the silicon film is relatively low when the CMP slurry exhibits a neutral pH. It is therefore preferable to use the pH control additive(s) to obtain a slurry pH in the range of 4~9.

Polyethylene imine (PEI) is a preferred oxide film removal retarder for the slurry of the first embodiment. Other exemplary compounds that can be alternatively or additionally used as the oxide film removal retarder include choline hydroxide, choline salt, tetra-methylammonium hydroxide, and tetra-alkylammonium salt. The oxide film removal retarder compound reacts with silanol radicals formed on a surface of the silicon oxide film through a hydrogen bond or an electrostatic bond. The oxide film removal retarder is thus absorbed by the surface of the silicon oxide film and acts as a buffer to reduce the removal rate of the silicon oxide film. Preferrably, polyethylene imine is used as the oxide film removal retarder in an amount of 0.1~5 wt % of the total weight of the CMP slurry. More preferably, the imine polyethylene is in an amount 0.15~0.5 wt % of the total weight of the CMP slurry.

First Experiment

CMP equipment designated as F-REX 200 and manufactured by Ebara Co. was used for the experiments described herein. The polishing pads used were an IC 1000 pad for the top polishing pad and a SUBA 4 pad for the sub polishing pad. All experimental data were obtained under the following operating conditions: (1) contact pressure (polishing load) of the wafer to the polishing pad was 250 hPa, and (2) rotational speed of the polishing plate, to which the polishing pad was attached, was 80 rpm.

In order to observe the effect of the oxidants in the CMP process, a removal rate of an aluminum film, a removal rate of a PE-TEOS film (inter metal dielectric (IMD) layer), and a reflective index (RI) after a CMP process were measured with respect to different oxidants contained in respective CMP slurries. Each slurry contained 10 wt % colloidal silica, and oxidant concentration of each was 0.1 M. The results of the first experiment are summarized in Table 1. Referring to Table 1, in view of the removal rate of the aluminum film, the removal rate selectivity of the aluminum film to the silicon oxide film, and the surface characteristic (reflective index) of the aluminum film after the CMP process, it can be said that hydrogen peroxide is the most suitable oxidant among those tested.

TABLE 1

| Oxidant | Removal rate of aluminum film (Å/Min.) | Removal rate of PE-TEOS film (Å/Min.) | Removal rate selectivity (Al:PE-TEOS) | Reflexive index (RI) |
|---|---|---|---|---|
| Hydrogen peroxide | 2,836 | 134 | 21:1 | 205 |
| Hydroxylamine | 2,466 | 154 | 16:1 | 46 |
| Ammonium per-sulfate | 2,238 | 821 | 3:1 | 208 |
| Ammonium cerium nitrate | 1,793 | 862 | 2:1 | 208 |

Second Experiment

In order to observe the effect of the pH of the slurry in the CMP process, the removal rate of the aluminum film and the removal rate of the PE-TEOS film were measured while varying the pH of the slurry. Nitric acid and potassium hydroxide were used for the titrant, i.e., as additives for adjusting the pH. In the second experiment, a slurry having 10 wt % colloidal silica and 10 wt % hydrogen peroxide was prepared. Afterward, measurements were carried out using slurries in which the pH was controlled by adding the titrant. The results are summarized in Table 2 and depicted in FIG. 1A. Referring to Table 2 and FIG. 1A, the removal rate of the aluminum film and the silicon oxide film varied according to the pH of the slurry. In particular, when the pH of the first slurry is in a range of 4~9, the removal rate selectivity of the aluminum film to the silicon oxide film is the greatest.

TABLE 2

| pH of slurry | Removal rate of aluminum film (Å/Min.) | Removal rate of PE-TEOS film (Å/Min.) | Removal rate selectivity (Al:PE-TEOS) |
|---|---|---|---|
| 2.1 | 2,543 | 1,165 | 2:1 |
| 4.5 | 3,109 | 469 | 7:1 |
| 6.0 | 3,375 | 297 | 11:1 |
| 7.6 | 2,863 | 173 | 16:1 |
| 8.5 | 2,328 | 222 | 11:1 |
| 9.9 | 1,614 | 335 | 5:1 |
| 10.7 | 1,617 | 453 | 4:1 |

Figure 1B:
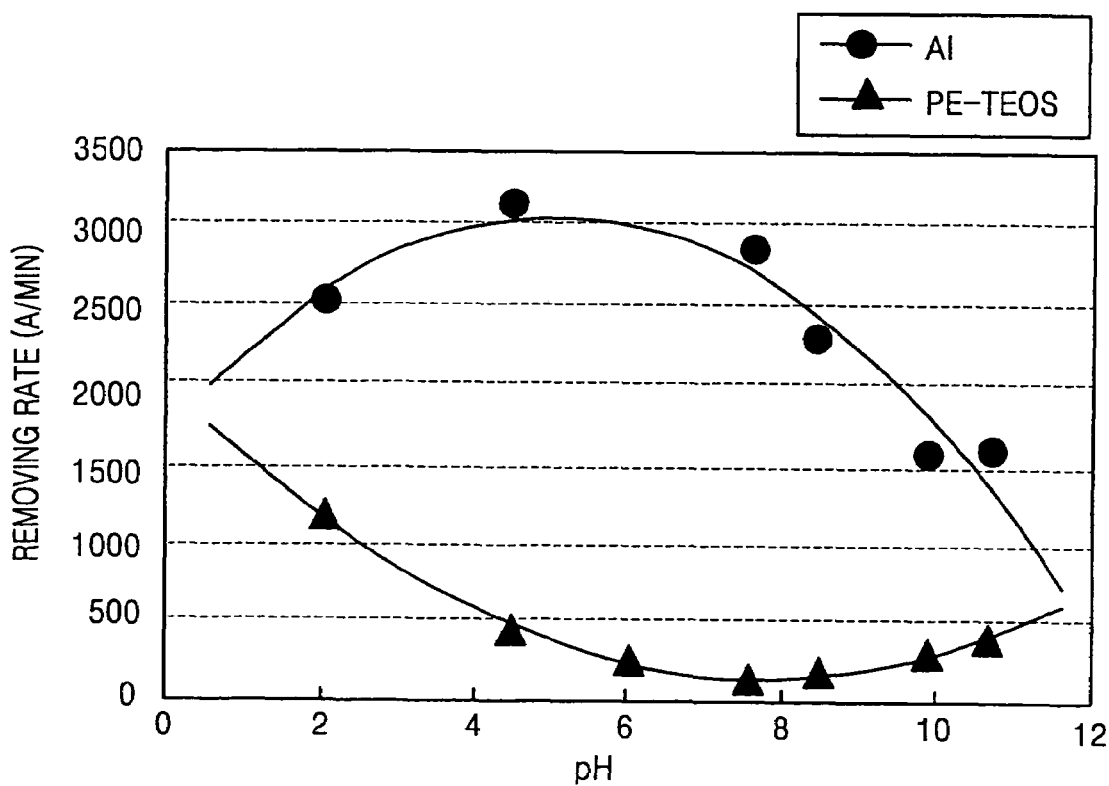
FIG. 1B is a graph showing removal rates of an aluminum film and a PE-TEOS film relative to the pH of a CMP slurry including nitric acid and potassium hydroxide.

FIG. 1B shows measurement results of the same experiment carried out using nitric acid and potassium hydroxide as the titrant. Referring to FIG. 1B, it is observed that the pH exhibiting the maximum removal rate selectivity in FIG. 1B is different from that of the pH in FIG. 1A. However, a general range of pH to achieve a high removal rate selectivity is similar to that of the range in FIG. 1A.

Third Experiment

In order to observe the effects of the oxide film removal retarder of the CMP slurry, the removal rates of the aluminum film and the PE-TEOS film were measured while varying the type of oxide film removal retarder. In the third experiment, a slurry having 10 wt % colloidal silica and 10 wt % hydrogen peroxide was prepared. Afterward, measurements were carried out which respect to slurries having different oxide film removal retarders added thereto. The amount of each oxide film removal retarder added to the slurries was 0.5 wt % of the total weight of each slurry. The measurement results of the third experiment are summarized in Table 3. Referring to Table 3, it is seen the first slurry comes close to a neutral when polyethylene imine is added, and, the removal rate selectivity of the aluminum film to the silicon oxide film was the greatest in the case of polyethylene imine.

TABLE 3

| Oxide film removal retarder | pH of slurry | Removal rate of aluminum film (Å/Min.) | Removal rate of PE-TEOS film (Å/Min.) | Removal rate selectivity (Al:PE-TEOS |
|---|---|---|---|---|
| PEI | 7.7 | 2,151 | 17 | 123:1 |
| Choline | 10.6 | 3,569 | 93 | 37:1 |
| TMAH | 10.8 | 4,483 | 134 | 34:1 |

Figure 2:
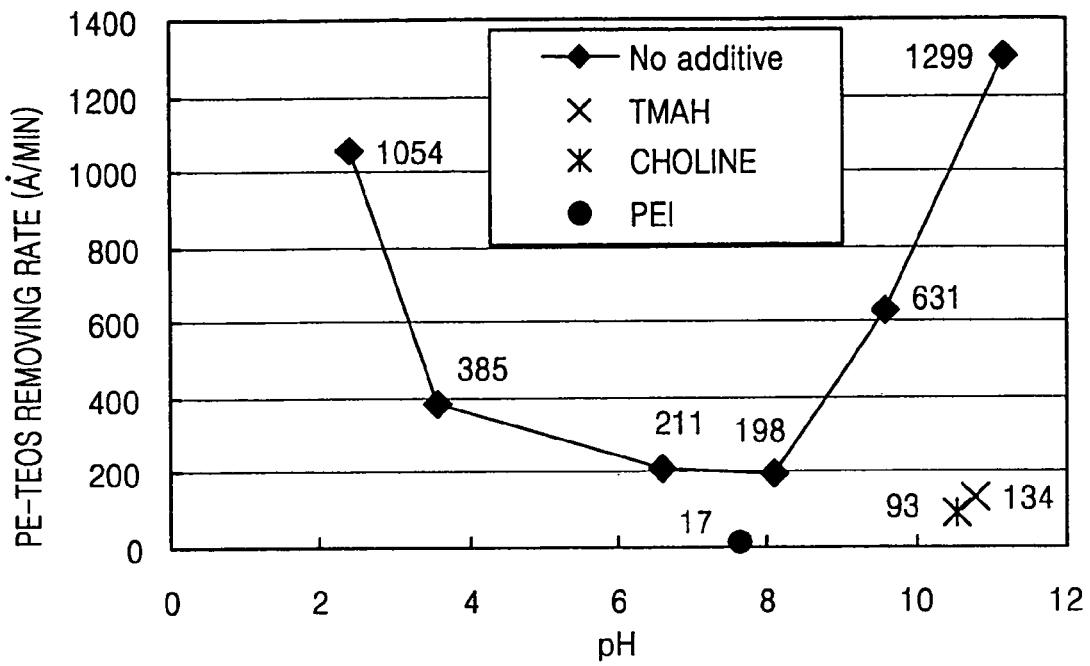
FIG. 2 is a graph showing a removal rate of a PE-TEOS film relative to the pH of a CMP slurry having different oxide film removal retarders.

FIG. 2 is a graph showing the measurement results of the third experiment. In addition, FIG. 2 also shows the case where no oxide film removal retarder was added to the first slurry. As shown in FIG. 2, when the oxide film removal retarder is added to the slurry, the removal rate of the PE-TEOS film is reduced. This is especially so in the case of polyethylene imine in which a substantial reduction in the PE-TEOS removal rate is realized, thus desirably increasing the removal rate selectivity.

Fourth Experiment

Figure 3:
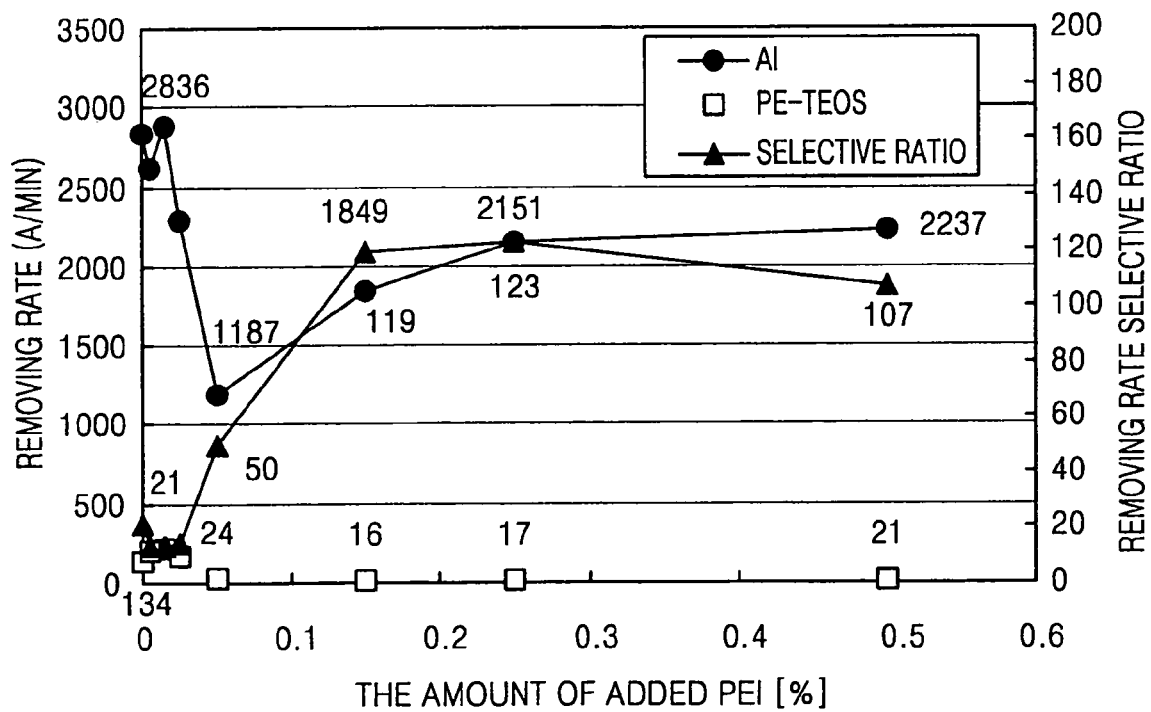
FIG. 3 is a graph showing removal rates of an aluminum film and a PE-TEOS film relative to an amount of polyethylene imine (PEI) added to a CMP slurry.

In order to observe the effect of the amount of the polyethylene imine in the CMP slurry, the removal rates of the aluminum film and the PE-TEOS film were measured while varying the amount of polyethylene imine in the slurry. In the fourth experiment, a slurry having 10 wt % colloidal silica and 10 wt % hydrogen peroxide was prepared. Afterwards, measurements were carried out with respect to slurries having different amounts of polyethylene imine added thereto. The measurement results are summarized in Table 4 and graphically illustrated in FIG. 3. As shown, when more than 0.1 wt % polyethylene imine is added, the removal rate of PE-TEOS film is reduced substantially, resulting in a large removal rate selectivity of the aluminum film to the silicon oxide film.

TABLE 4

| Amount of PEI added (wt %) | Removal rate of aluminum film (Å/Min.) | Removal rate of PE-TEOS film (Å/Min.) | Removal rate selectivity (Al:PE-TEOS |
|---|---|---|---|
| 0 | 2,836 | 134 | 21:1 |
| 0.01 | 2,612 | 202 | 13:1 |
| 0.03 | 2,886 | 214 | 13:1 |
| 0.05 | 2,293 | 167 | 14:1 |
| 0.1 | 1,187 | 24 | 50:1 |
| 0.3 | 1,849 | 16 | 119:1 |
| 0.5 | 2,151 | 17 | 123:1 |
| 1 | 2,237 | 21 | 107:1 |

CMP Slurry of a Second Embodiment

A slurry for CMP of an aluminum film according to a second embodiment of the present invention is a compound containing a polishing agent, an oxidant, a pH control additive, an oxide film removal retarder which reduces a removal rate of a silicon oxide film, and a defect prevention agent which inhibits at least one of scratch defects and corrosion defects at a surface of the aluminum film.

The polishing agent, oxidant, pH control additive, oxide film removal retarder of the slurry of the second embodiment may be the same as those contained in the slurry of the first embodiment. Accordingly, to avoid redundancy, reference is made to the previous description as to the compositions, contents and functions of the polishing agent, oxidant, pH control additive, oxide film removal retarder of the slurry of the second embodiment. Preferably, in the slurry of the second embodiment, the polishing agent includes colloidal silica, the oxidant includes hydrogen peroxide, the pH control additive includes nitric acid and/or potassium hydroxide, and the oxide film removal retarder includes ployethylene imine.

The slurry of the first embodiment can provide a high removal rate selectivity of the aluminum film to the silicon oxide film, and to some degree, it can suppress the occurrence of scratches and corrosion defects on the surface of the aluminum film during a CMP process. However, to further suppress surface defects, the slurry of the second embodiment is additionally provided with a defect prevention agent.

Ethylenediaminetetra-acetic acid (EDTA) and/or a salt of EDTA are preferred defect prevention agents of the slurry of the second embodiment of the present invention. Other exemplary compounds which may alternatively or additionally be used as the defect prevention agent include benzotriazole (BTA), L-prolyne, and salts thereof. The defect prevention agent inhibits defects on the surface of the aluminum film by forming a protective film on the surface of the aluminum film. For example, a material that can be adsorbed by the surface of the aluminum film by forming a kylate compound in reaction with positive aluminum ions can be used. Accordingly, the defect prevention agent may be a material that contains a chemical radical to form a kylate in reaction with the aluminum ions. Chemical radicals that can form kylate in reaction with the aluminum ions are carboxyl radical (—COOH), amine radical (—NH2), or azo radical (—N=N—). Preferably, the CMP slurry of the second embodiment includes EDTA or a salt of EDTA in an amount of 0.01~1 wt % of the total weight of the CMP slurry.

Fifth Experiment

In order to observe the effects of the defect prevention agent and to select a suitable defect prevention agent, measurements were carried out while adding different types of defect prevention agents to the CMP slurries. This experiment was carried out using the same CMP equipment and under the same process conditions as the first through the fourth experiments. In the fifth experiment, slurries containing 10 wt % colloidal silica, 1 wt % hydrogen peroxide, 0.5 wt % polyethylene imine, and 0.1 wt % defect prevention agent were used. The defect prevention agent was varied for each slurry, and the pH of each slurry was controlled in a range of 4~9.

The measurement results of the fifth experiment are summarized in Table 5. Referring to Table 5, the reflective index is quite high (meaning minimal surface defects are present), but does not vary widely among the different defect prevention agents. However, when also considering the removal rate of the aluminum film together with the removal rate selectivity of PE-TEOS film, it can be said that the EDTA salt is the most preferably compound to be used as a defect prevention agent.

TABLE 5

| Defect prevention agent | Removal rate of aluminum film (Å/Min.) | Removal rate of PE-TEOS film (Å/Min.) | Removal rate selectivity (Al:PE-TEOS) | Reflective index of aluminum film (RI) |
| --- | --- | --- | --- | --- |
| BTA | 922 | 32 | 29:1 | 209 |
| L-prolyne | 895 | 23 | 39:1 | 209 |
| EDTA diammonium salt | 1,332 | 20 | 67:1 | 210 |

Figure 4:
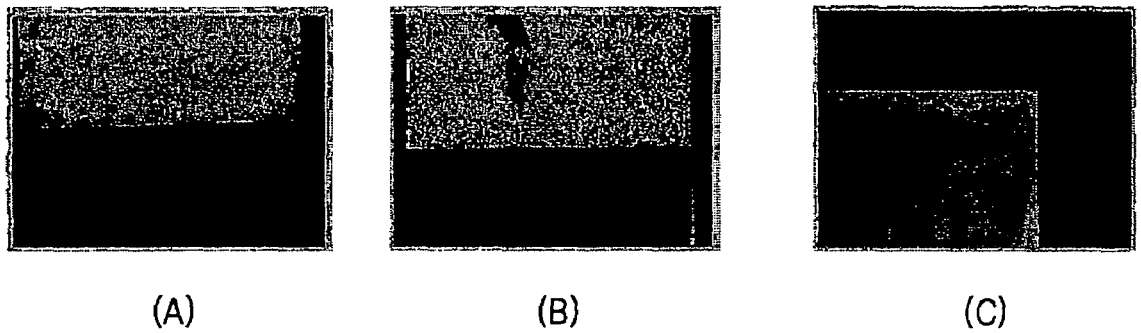
FIG. 4 shows photo images of surfaces of aluminum films after performing CMP processes using different CMP slurries.

FIG. 4 shows three photo images of aluminum films obtained by CMP processes using three different kinds of slurries. The slurry used in connection with image (A) of FIG. 4 contained 10 wt % colloidal silica and 1 wt % hydrogen peroxide, and had a pH of 7. The slurry used in connection with image (B) of FIG. 4 was obtained by adding 0.5 wt % polyethylene imine to the slurry used in connection with image (A). The slurry used in connection with image (C) of FIG. 4 was obtained by adding 0.1 wt % EDTA to the slurry used in connection with image (B). As shown, a substantial number of defects are observed on the surface of the aluminum film of image (A), and fewer defects are observed in image (B). However, the surface of the aluminum film in the case of image (C) is nearly free of defects.

Two-Step CMP Process

FIGS. 5A through 5D are cross-sectional views for explaining a CMP method for forming an aluminum wiring according to an exemplary embodiment of the present invention. The method described with reference to FIGS. 5A through 5D is a method using a damascene process, but the present invention is not limited thereto. That is, the present invention is applicable to all processes for forming an aluminum wiring in which a CMP process for an aluminum film is included.

Figure 5A:
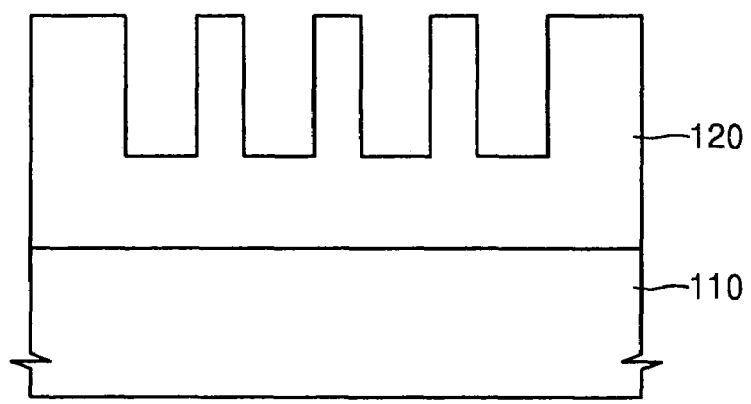
FIGS. 5A through 5D are cross-sectional views for explaining a method of forming an aluminum wiring using a two-step CMP process according to an embodiment of the present invention.

Referring to FIG. 5A, an inter metal dielectric (IMD) layer pattern 120 is formed on a semiconductor substrate 110 in which a region for forming an aluminum wiring is defined. The IMD layer pattern 120 can be formed by a conventional photolithography process used in the art. A different material layer having a semiconductor circuit thereon can be interposed between the semiconductor substrate 110 and the IMD layer pattern 120. The IMD layer pattern 120 can, for example, be formed of a dielectric material such as a phosphate doped silica glass (PSG), boron-phosphate doped silica glass (BPSG), plasma enhanced tertraethylorthosilicate (PE-TEOS), or a silicon oxide induced by silan.

Figure 5B:
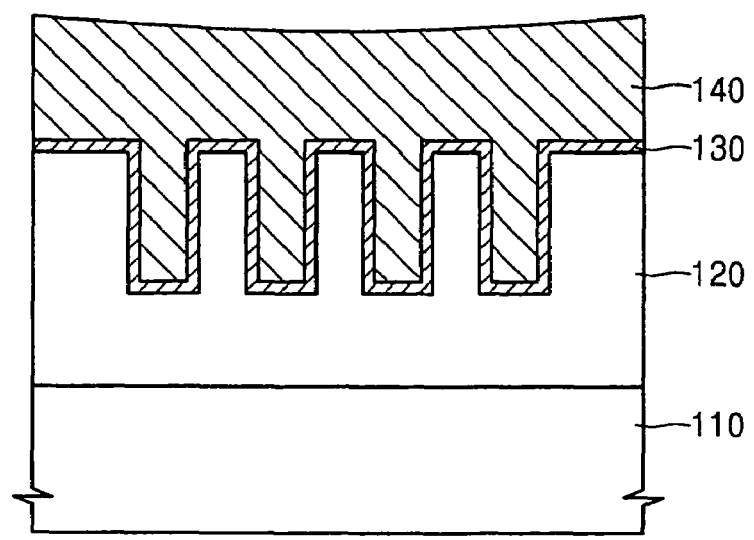

Referring to FIG. 5B, after forming a metal barrier layer 130 on the inter metal dielectric layer pattern 120, an aluminum film 140 is deposited thickly on the metal barrier layer 130. The metal barrier layer 130 can, for example, be formed of titanium, titanium nitride, tantalum, or tantalum-nitride, or composites of these materials.

Figure 5C:
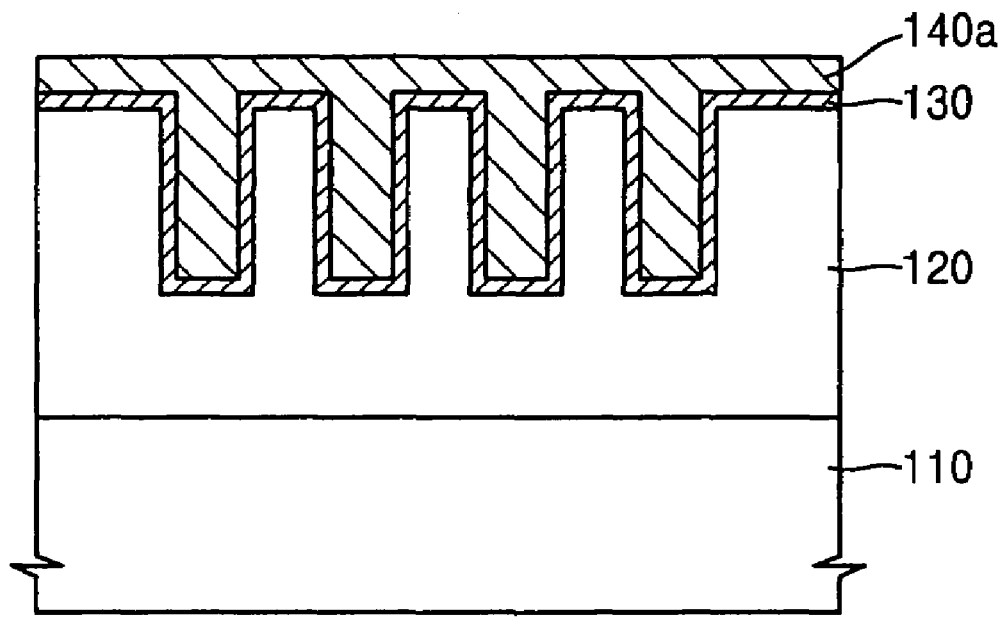

Referring to FIG. 5C, a first CMP process is performed on the resultant structure of FIG. 5B. In the first CMP process, it is preferable to use the slurry of the first embodiment of the present invention (which does not contain a defect prevention agent) so as to increase throughput by way of a higher polishing rate. This is because the defect prevent agent contained in the slurry of the second embodiment can reduce the removal rate of the aluminum film, thereby increasing the CMP process time.

Also preferably, the first CMP process is halted prior to exposure of the metal barrier layer 130. This is because the slurry of the first embodiment does not include the defect prevention agent, and accordingly scratch or corrosion defects can appear on the metal barrier layer 130 if the first CMP process is continued until the metal barrier layer 130 is exposed. Such scratch or corrosion defects could eventually cause defects on the aluminum wiring. For example, the first CMP process should preferably be halted when the residual thickness of the aluminum film 140A is approximately in a range of 100~1000 Å.

Figure 5D:
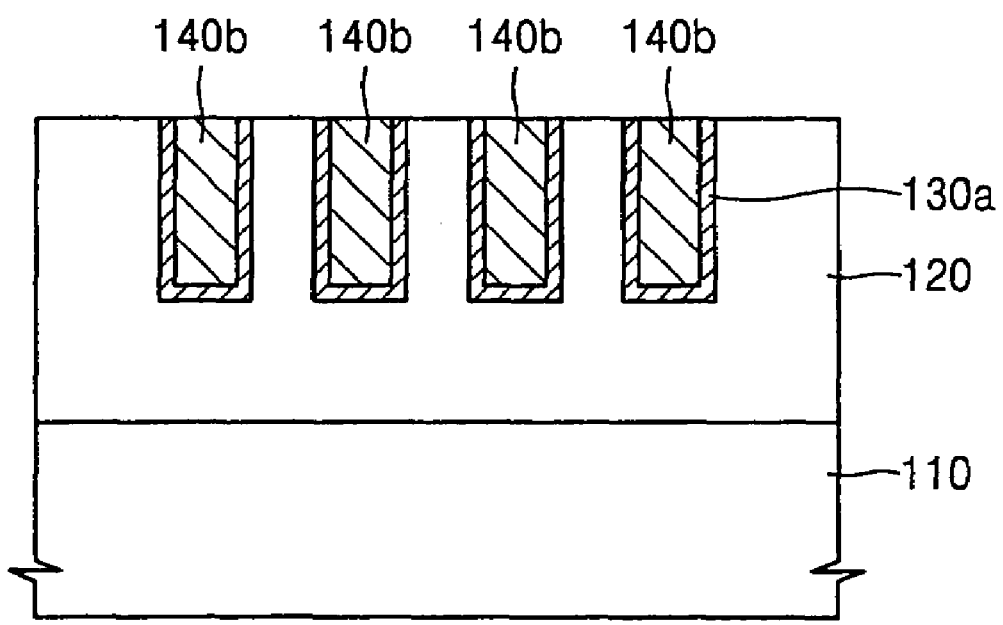

Referring to FIG. 5D, a second CMP process is performed on the resultant structure of FIG. 5C. In the second CMP process, the slurry of the second embodiment of the invention is preferably used. Unlike the first CMP process in which throughput is important, the second CMP process should be carried out so as to avoid the creation of scratch or corrosion defects on the surface of the aluminum film. The defect prevention agent, such as EDTA salt, of the slurry of the second embodiment is effective in this regard. As shown in FIG. 5D, the second CMP process is continued until the aluminum film and the metal barrier layer formed on the upper surface of the IMD layer pattern 120 are completely removed. As a result, metal barrier layers 130a and aluminum wirings 140b are formed within the IMD layer pattern 120.

Processing times of the first CMP process and the second CMP process can be controlled using an end point detect (EPD) control method. For example, a polishing degree of a material film being polished can be detected by detecting a change of current in a motor when the EPD control method is employed. Accordingly, an end point of the first CMP process and the commencing point of the second CMP process can be readily determined by employing the EPD control method for a two-step process like that of the present method.

Figure 7:
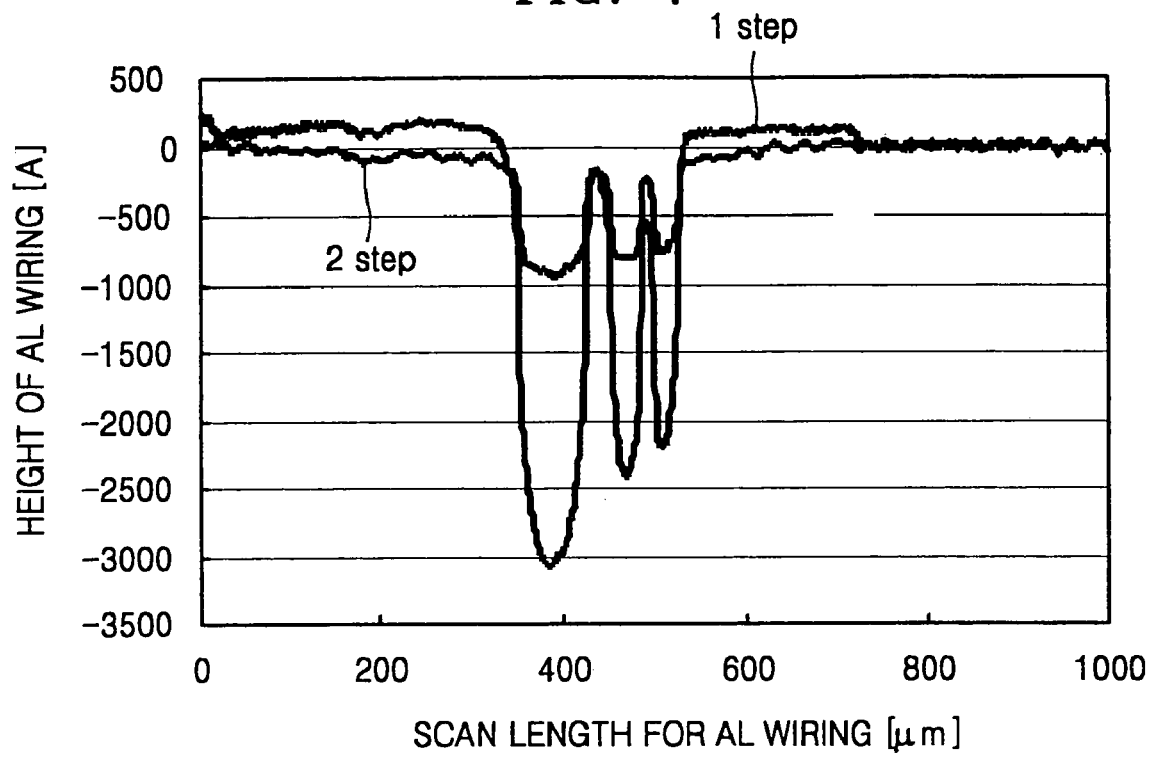
FIG. 7 is a graph showing measured heights of an aluminum wiring relative to length locations of the aluminum wiring.

The aluminum wiring formed according to the exemplary embodiment of the present invention is not over etched, and dishing and erosion defects are mitigated due to the use of slurries having high removal rate selectivities. FIG. 7 contains graphs showing heights of the aluminum wire measured along scan lengths of the aluminum wiring. FIG. 7 includes a graph (second step) based on measurement results according to the two-step CMP process of the present embodiment and a graph (first step) based on measurement results according to the single-step CMP process. Referring to FIG. 7, it is seen that the occurrence of dishing in the two-step CMP process is substantially mitigated.

Figure 8A:
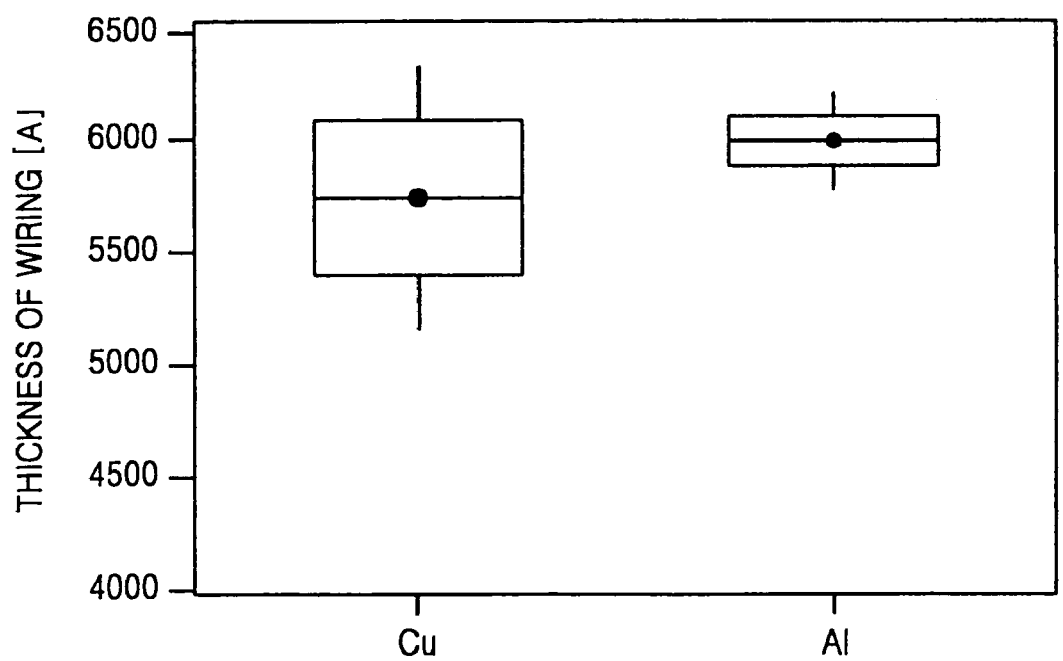
FIG. 8A is a graph showing measured thicknesses of an aluminum wiring and a copper wiring after performing a CMP process.
Figure 8B:
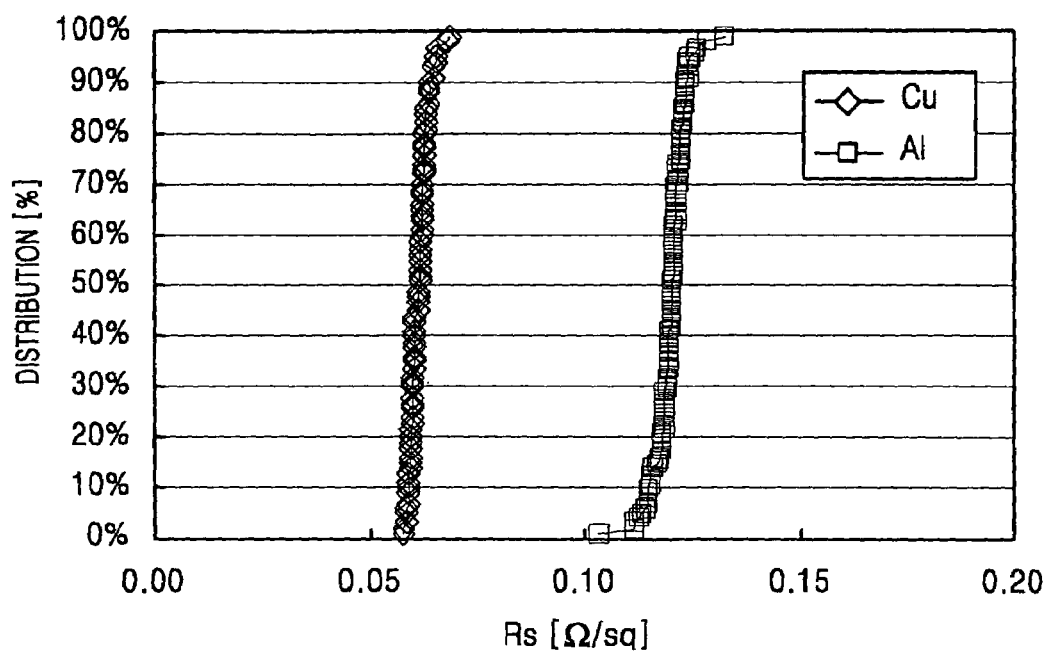
FIG. 8B is a graph showing measured sheet resistances (Rs) of a copper wiring and an aluminum wiring after performing a CMP process.
Figure 8C:
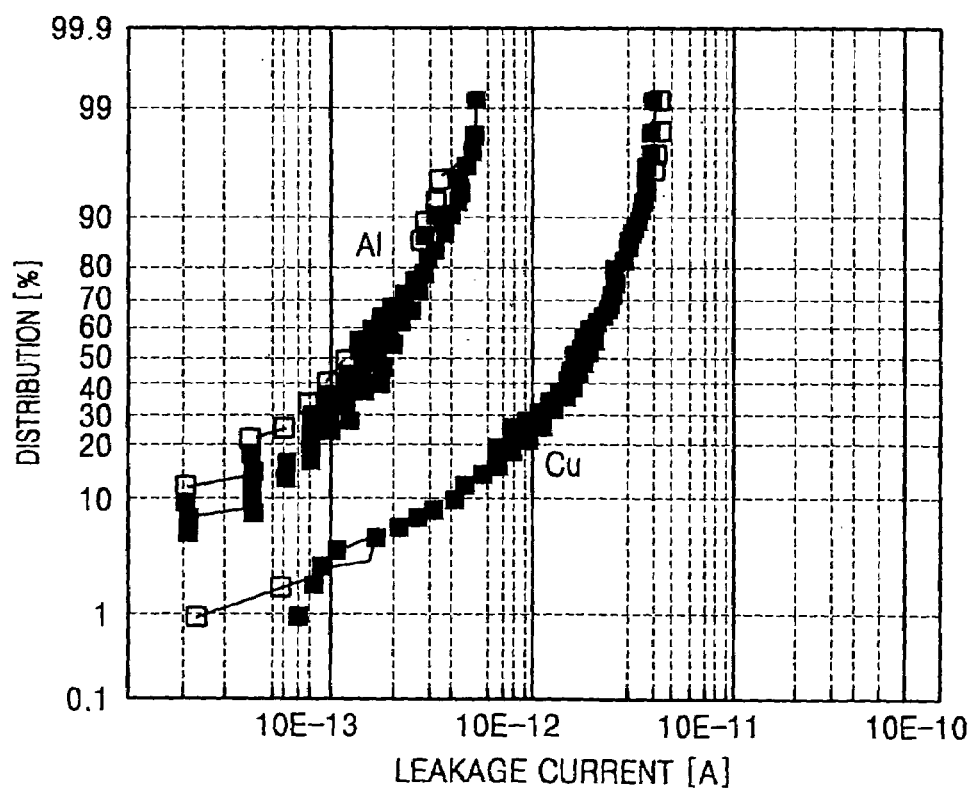
FIG. 8C is a graph showing measured leakage currents of a copper wiring and an aluminum wiring after performing a CMP process.

FIGS. 8A through 8C are graphs showing measurement results of characteristics of a copper wiring and an aluminum wiring each having the same pattern and each formed using a damascene process. The two-step CMP process of the present embodiment was used in forming the aluminum wiring.

In FIG. 8A, thicknesses of the copper wiring and the aluminum wiring after performing the CMP processes are shown. Referring to FIG. 8A, the thickness of the copper wiring lies in a range of approximately 5,400~6,000 Å, having a deviation of approximately 600 Å. On the other hand, the thickness of the aluminum wiring lies in a range of approximately 5,800~6,000 Å, having a deviation of 200 Å. Accordingly, when the second CMP process according to the exemplary embodiment of the present invention is employed for wiring, the loss of an aluminum film is less than that of a copper film, and an aluminum wiring having a favorable thickness distribution can be formed.

In FIG. 8B, measurement results of sheet resistances (Rs) of the copper wiring and the aluminum wiring after performing a CMP process are shown. In general, the sheet resistance of a wiring material is proportional to the specific resistance of the wiring material, and inversely proportional to the thickness of the wiring material. Specific resistance of copper is approximately 1.7 $\mu\Omega\cdot$cm, and that of the aluminum is 3.2 $\mu\Omega\cdot$cm. Referring to FIG. 8B, it is seen that the use of the two-step CMP process according to the present embodiment can control the removal quantity of an aluminum wiring to be equal to or less than the removal quantity of the copper wiring.

In FIG. 8C, measurement results of leakage currents of a copper wiring and an aluminum wiring after CMP processes are depicted. In general, leakage current is considered to lie in a favorable range when it is less than $10^{-11}$ A or $10^{-12}$ A. Referring to FIG. 8C, it is seen that both the copper wiring and the aluminum wiring are within the favorable range. However, the aluminum wiring fabricated according to the present exhibits the lower leakage current. Accordingly, disconnection between neighboring aluminum wirings due to the residual aluminum caused by under etching of the aluminum film can be avoided when using the two-step CMP process of the present embodiment.

One-Step CMP Process

Figure 6A:
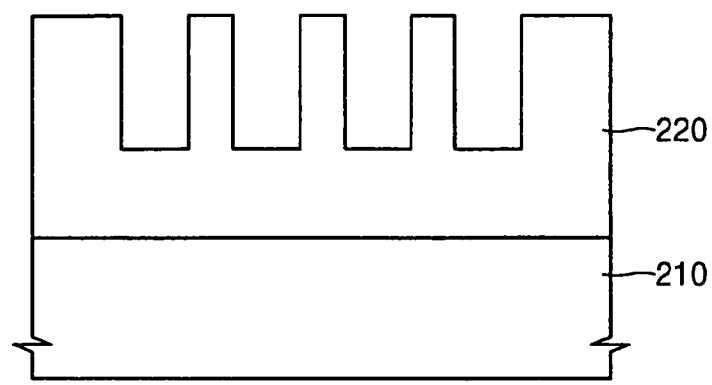
FIGS. 6A through 6C are cross-sectional views for explaining a method of forming an aluminum wiring according to another embodiment of the present invention.
Figure 6B:
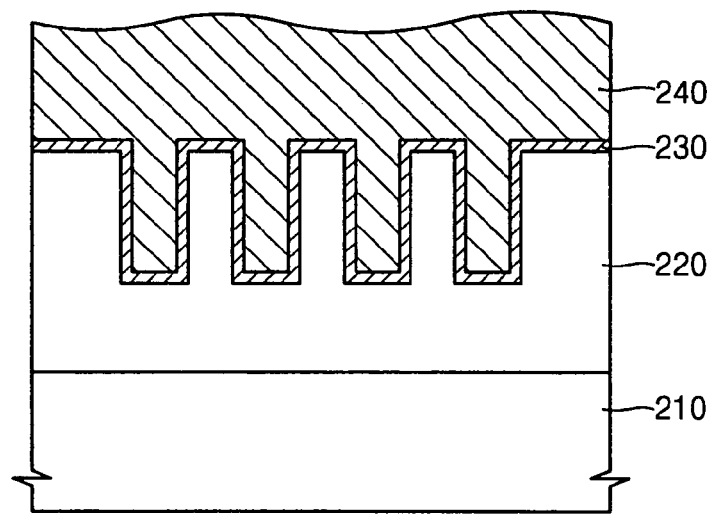
Figure 6C:
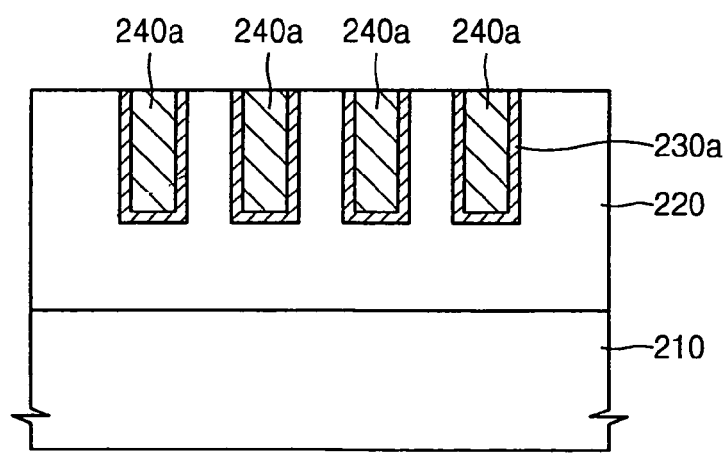

FIGS. 6A through 6C are cross-sectional views for describing a method of forming an aluminum wiring according to another embodiment of the present invention. The method described with reference to FIGS. 6A to 6C is a method using a damascene process, but the exemplary embodiment of the present invention is not limited thereto. That is, the exemplary embodiment of the present invention is applicable to all processes for forming an aluminum wiring in which a CMP process for an aluminum film is included.

Referring to FIG. 6A, an inter metal dielectric layer (IMD) layer pattern 220 is formed on a semiconductor substrate 210 on which a region for forming an aluminum wiring is defined. The IMD layer pattern 220 can be formed by a conventional photolithography process used in the art. A different material layer having a semiconductor circuit thereon can be interposed between the semiconductor substrate 210 and the IMD layer pattern 220. The IMD layer pattern 220 can, for example, be formed silicon oxide, PSG, BPSG, or silicon oxide induced by silan.

Referring to FIG. 6B, after forming a metal barrier layer 230 on the IMD layer pattern 220, an aluminum film 240 is formed by thick coating on the metal barrier layer 230. The metal barrier layer 230 can, for example, be formed of titanium, titanium nitride, tantalum, or tantalum-nitride, and composites of these materials. So far, the method described with respect to FIGS. 6A to 6B is the same as the method described previously with regard to FIGS. 5A to 5B.

Referring to FIG. 6C, a CMP process is performed on the resultant structure of FIG. 6B. The CMP process of this embodiment can use the slurry of the first embodiment of the present invention. However, use of the slurry containing the defect prevention agent of the second embodiment of the present invention is preferred. The CMP process is continued using only the same slurry of the first embodiment or the second embodiment until the metal barrier layer 230 formed on the upper surface of the IMD layer pattern 220 is completely removed. As the result, a metal barrier layer 230a and an aluminum wiring 240a as depicted in FIG. 6C are formed.

The one-step CMP process of the present embodiment is simplified when compared to the two-step CMP process of the previous embodiment. Also, particularly in the case where the CMP slurry of the second embodiment is utilized throughout the CMP process, problems of over etching of the aluminum film, dishing, and/or erosion can be effectively minimized. The one-step CMP process may be particularly useful when forming a relatively thin aluminum film.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of treating an aluminum film formed over a silicon oxide film pattern which defines an aluminum wiring region, said method comprising forming an aluminum film on the silicon dioxide film pattern, and forming aluminum wirings within the aluminum wiring region defined within the silicon dioxide film pattern by performing a two-step chemical mechanical polishing (CMP) process, wherein the two-step CMP process comprises:

performing a first CMP which removes a part of the aluminum film using a first slurry comprising a polishing agent, an oxidant, a pH control additive, and an oxide film removal retarder which reduces a removal rate of the silicon oxide film, wherein the first slurry is devoid of a defect prevention agent which inhibits at least one of scratch defects and corrosion defects at a surface of the aluminum film;

stopping the first CMP when a predetermined thickness of the aluminum film remains on a top surface of the silicon dioxide film pattern;

forming the aluminum wirings by performing a second CMP which removes another part of the aluminum film using a second slurry comprising a polishing agent, an oxidant, a pH control additive, an oxide film removal retarder which reduces a removal rate of the silicon oxide film, and a defect prevention agent which inhibits at least one of scratch defects and corrosion defects at a surface of the aluminum film.

2. The method of claim 1, wherein the polishing agent of the first slurry and the second slurry comprises colloidal silica.

3. The method of claim 1, wherein the oxidant of the first slurry and the second slurry comprises hydrogen peroxide in amounts of 0.5~5 wt % of the respective total weights of the first slurry and the second slurry.

4. The method of claim 1, wherein the pH of the first slurry and the pH of the second slurry are in a range of 4~9.

5. The method of claim 1, wherein the oxide film removal retarder of the first slurry and the second slurry comprises polyethylene imine in amounts of 0.1~5 wt % of the respective total weights of the first slurry and the second slurry.

6. The method of claim 1, wherein the defect prevention agent of the second slurry comprises at least one of ethylenediaminetetra-acetic acid (EDTA) and a salt of EDTA in an amount of 0.01~1 wt % of the total weight of the second slurry.

7. The method of claim 1, wherein the polishing agent of the first slurry and the second slurry comprises colloidal silica, wherein the oxidant of the first slurry and the second slurry comprises hydrogen peroxide, wherein the oxide film removal retarder of the first slurry and the second slurry comprises polyethylene imine, and wherein the defect prevention agent of the second slurry comprises at least one of ethylenediaminetetra-acetic acid (EDTA) and a salt of EDTA.

8. A method of forming an aluminum wiring, comprising:
forming an inter metal dielectric (IMD) layer comprising silicon oxide over a semiconductor substrate;
patterning the IMD layer to define an aluminum wiring region;
forming a metal barrier layer on the patterned IMD layer to obtain a resultant structure;
coating the resultant structure with an aluminum film; and
forming aluminum wirings within the aluminum wiring region defined within the patterned IMD by performing a two-step chemical mechanical polishing (CMP) process,
wherein the two-step CMP process comprises:
performing a first CMP which removes a part of the aluminum film using a first slurry comprising a polishing agent, an oxidant, a pH control additive, and an oxide film removal retarder which reduces a removal rate of the silicon oxide film, wherein the first slurry is devoid of a defect prevention agent which inhibits at least one of scratch defects and corrosion defects at a surface of the aluminum film;
stopping the first CMP when a predetermined thickness of the aluminum film remains on a top surface of the metal barrier layer;
forming the aluminum wirings within the aluminum wiring region by performing a second CMP which removes another part of the aluminum film using a second slurry comprising a polishing agent, an oxidant, a pH control additive, an oxide film removal retarder which reduces a removal rate of the silicon oxide film, and a defect prevention agent which inhibits at least one of scratch defects and corrosion defects at a surface of the aluminum film.

* * * * *